(12) United States Patent
Kawaguchi et al.

(10) Patent No.: US 8,847,178 B2
(45) Date of Patent: Sep. 30, 2014

(54) CHARGED PARTICLE BEAM WRITING APPARATUS AND CHARGED PARTICLE BEAM WRITING METHOD

(71) Applicant: NuFlare Technology, Inc, Numazu (JP)

(72) Inventors: Michihiro Kawaguchi, Shizuoka (JP);
Kazuhiro Shiba, Shizuoka (JP);
Keisuke Yamaguchi, Shizuoka (JP);
Kiminobu Akeno, Kanagawa (JP);
Yoshinori Kagawa, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 13/625,231

(22) Filed: Sep. 24, 2012

(65) Prior Publication Data

US 2013/0082193 A1    Apr. 4, 2013

(30) Foreign Application Priority Data

Sep. 29, 2011    (JP) .................................. 2011-214380

(51) Int. Cl.
| | |
|---|---|
| *G21K 5/00* | (2006.01) |
| *G03F 9/00* | (2006.01) |
| *G21K 5/08* | (2006.01) |
| *H01L 21/00* | (2006.01) |
| *G03F 7/00* | (2006.01) |

(52) U.S. Cl.
CPC ................. *G21K 5/08* (2013.01); *G03F 9/7096* (2013.01); *H01L 21/00* (2013.01); *G03F 7/00* (2013.01)
USPC .................... 250/491.1; 250/492.1; 250/492.3

(58) Field of Classification Search
USPC ................... 250/491.1, 492.1, 492.2, 492.21, 250/492.22, 492.23, 492.3
See application file for complete search history.

(56) References Cited

U.S. PATENT DOCUMENTS

2004/0195526 A1*   10/2004   Nakada et al. ............. 250/492.1
2011/0155930 A1*    6/2011   Kawaguchi et al. ..... 250/492.22

FOREIGN PATENT DOCUMENTS

JP              2011-14630 A          1/2011

OTHER PUBLICATIONS

Office Action issued Mar. 27 2014 in Korean Patent Application No. 10-2012-0108908 with English Translation).
Office Action issued Jun. 3, 2014 to Taiwanese Patent Application 101133482, with English translation.

* cited by examiner

*Primary Examiner* — Nicole Ippolito
(74) *Attorney, Agent, or Firm* — Oblon, Spivak, McClelland, Maier & Neustadt, L.L.P.

(57) ABSTRACT

A charged particle beam writing apparatus according to one aspect of the present invention includes a substrate cover attachment/detachment unit to attach or detach a substrate cover that covers a whole periphery of a substrate being a writing target from an upper part, to/from the substrate, a writing unit to write a pattern on the substrate, in a state where the substrate cover is attached to the substrate, by a charged particle beam, a position measurement unit, before and after writing by the writing unit, to measure a position of the substrate cover in a state attached to the substrate, at a predetermined measurement position, and a correction unit, with respect to a position of the substrate to which the substrate cover is attached, to correct a positional deviation amount between a position of the substrate cover measured after writing and a position of the substrate cover measured before writing.

17 Claims, 17 Drawing Sheets

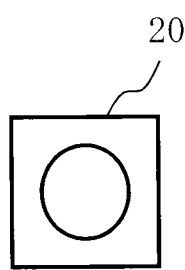
FIG. 9A
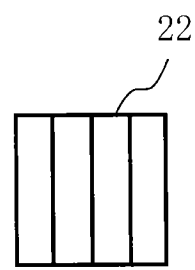
FIG. 9C
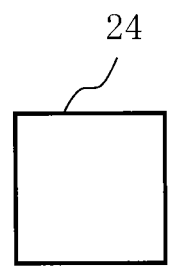
FIG. 9E
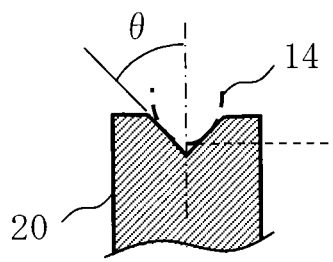
FIG. 9B
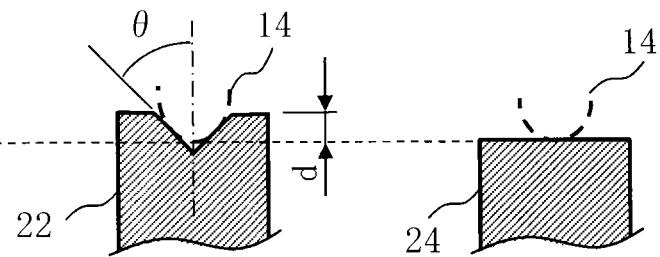
FIG. 9D
FIG. 9F

CHARGED PARTICLE BEAM WRITING APPARATUS AND CHARGED PARTICLE BEAM WRITING METHOD

CROSS-REFERENCE TO RELATED APPLICATION

This application is based upon and claims the benefit of priority from the prior Japanese Patent Application No. 2011-214380 filed on Sep. 29, 2011 in Japan, the entire contents of which are incorporated herein by reference.

BACKGROUND OF THE INVENTION

1. Field of the Invention

The present invention relates to a charged particle beam writing apparatus and a charged particle beam writing method. For example, the present invention relates to a writing apparatus that writes or draws a pattern on a substrate to which a substrate cover has been attached, by using an electron beam, and to a method thereof.

2. Description of Related Art

The lithography technique that advances microminiaturization of semiconductor devices is extremely important as being a unique process whereby patterns are formed in the semiconductor manufacturing. In recent years, with high integration of LSI, the line width (critical dimension) required for semiconductor device circuits is decreasing year by year. In order to form a desired circuit pattern on semiconductor devices, a master or "original" pattern (also called a mask or a reticle) of high precision is needed. Thus, the electron beam (EB) writing technique, which intrinsically has excellent resolution, is used for producing such a highly precise master pattern.

FIG. 19 is a schematic diagram explaining operations of a variable shaped electron beam writing apparatus. As shown in the figure, the variable shaped electron beam writing apparatus operates as described below. A first aperture plate 410 has a quadrangular opening 411 for shaping an electron beam 330. A second aperture plate 420 has a variable-shape opening 421 for shaping the electron beam 330 having passed through the opening 411 of the first aperture plate 410 into a desired quadrangular shape. The electron beam 330 emitted from a charged particle source 430 and having passed through the opening 411 is deflected by a deflector to pass through a part of the variable-shape opening 421 of the second aperture plate 420, and thereby to irradiate a target object or "sample" 340 placed on a stage which continuously moves in one predetermined direction (e.g. X direction) during the writing. In other words, a quadrangular shape that can pass through both the opening 411 and the variable-shape opening 421 is used for pattern writing in a writing region of the target object 340 on the stage continuously moving in the X direction. This method of forming a given shape by letting beams pass through both the opening 411 of the first aperture plate 410 and the variable-shape opening 421 of the second aperture plate 420 is referred to as a variable shaped beam method.

In a writing apparatus, there is a case of performing writing while covering the periphery of a mask (substrate) with a frame-like mask cover so that the insulated portion at the end surface of the mask serving as a target object may not be charged by reflected electrons of electron beams irradiating the mask. In such a case, the mask cover is kept in the transfer channel in the vacuum of the writing apparatus, and placed on the mask during the writing. When placing the cover on the mask, minute positional deviation may occur, for example, because the contact portion between the mask and the mask cover does not contact simultaneously. Moreover, positional deviation may occur, for example, because of a positioning error of the attaching/detaching mechanism at the time of placing the mask cover on the mask. Although positional deviation of the mask cover generated by one transferring operation or one writing operation is minute, if the cover is used for writing a plurality of times without performing alignment, unacceptable positional deviation may occur due to accumulated errors. Therefore, in order not to accumulate such errors, it is desirable to perform alignment each time before placing the cover on the mask so that the cover may be placed at a highly accurate position with respect to the mask. Thus, conventionally, an alignment function is provided in the support table which supports the mask cover, and mask cover alignment is performed every time the mask cover is supported. However, in such a supporting mechanism, when detaching the mask cover from the mask, since an alignment operation starts at the time of the mask cover having been supported by the supporting mechanism, there is a problem in that if the position is shifted, the mask cover slides in the direction parallel to the mask surface in order to correct the position, thereby scratching the mask. Accordingly, there is proposed a method of separately providing a support table for supporting the mask cover and a support table for performing alignment of the mask cover, and of executing alignment of the mask cover after detaching the mask cover from the mask (refer to, e.g., Japanese Patent Application Laid-open 2011-14630).

However, according to this mechanism, the portion in contact with the mask cover becomes increased because the supporting surface of the support table for performing mask cover alignment is added to the supporting surface of the support table for supporting the mask cover. Therefore, since the contact portion increases, the risk of generation of particles at the contact portion increases. That is, there is a problem that when the risk of particle generation increases, the risk of the particles coming onto the mask also increases.

BRIEF SUMMARY OF THE INVENTION

In accordance with one aspect of the present invention, a charged particle beam writing apparatus includes a substrate cover attachment/detachment unit to attach or detach a substrate cover that covers a whole periphery of a substrate being a writing target from an upper part, to/from the substrate, a writing unit to write a pattern on the substrate, in a state where the substrate cover has been attached to the substrate, by using a charged particle beam, a position measurement unit, before and after performing writing by the writing unit, to measure a position of the substrate cover in a state attached to the substrate, at a predetermined measurement position, and a correction unit, with respect to a position of the substrate to which the substrate cover has been attached, to correct a positional deviation amount between a measured position of the substrate cover measured after writing and a measured position of the substrate cover measured before writing.

In accordance with another aspect of the present invention, a charged particle beam writing method includes attaching a substrate cover that covers a whole periphery of a substrate being a writing target from an upper part to the substrate, measuring a position of the substrate cover in a state attached to the substrate, at a predetermined measurement position, before writing a pattern on the substrate, writing a pattern on the substrate, in a state where the substrate cover has been attached to the substrate, by using a charged particle beam, measuring a position of the substrate cover in a state attached to the substrate, at the predetermined measurement position, after writing a pattern on the substrate, correcting a positional deviation amount between a measured position of the substrate cover measured after writing and a measured position of the substrate cover measured before writing, with respect to a position of the substrate to which the substrate cover has been attached, and detaching the substrate cover attached to the substrate, after the positional deviation amount having been corrected.

BRIEF DESCRIPTION OF THE DRAWINGS

FIGS. 9A to 9F are schematic diagrams showing the shapes of the upper surfaces of three alignment support members according to Embodiment 1;

DETAILED DESCRIPTION OF THE INVENTION

In the following Embodiments, there will be described a structure in which an electron beam is used as an example of a charged particle beam. The charged particle beam is not limited to the electron beam, and other charged particle beam, such as an ion beam, may also be used.

There will be described an apparatus and a method capable of inhibiting scratching the substrate and inhibiting generating particles.

Embodiment 1

Figure 1:
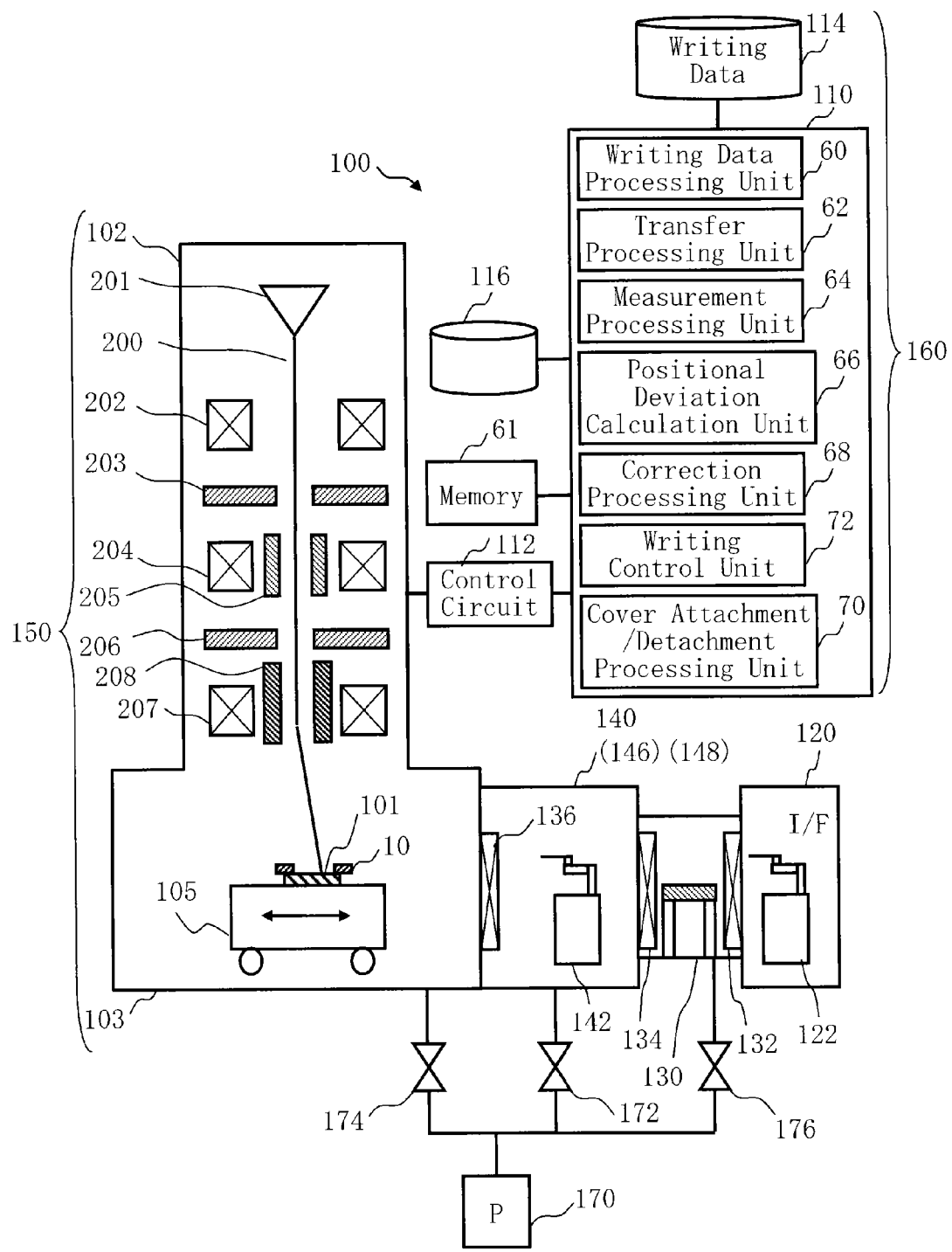
FIG. 1 is a schematic diagram showing a structure of a writing apparatus according to Embodiment 1.

FIG. 1 is a schematic diagram showing a structure of a writing apparatus according to Embodiment 1. In FIG. 1, a writing apparatus 100 includes a writing unit 150, a control unit 160, an interface (I/F) 120, a load lock (L/L) chamber 130, a robot chamber 140, an alignment chamber 146, a substrate cover attaching/detaching chamber 148, and a vacuum pump 170. The writing apparatus 100 is an example of a charged particle beam writing apparatus. The writing apparatus 100 writes a desired pattern onto a substrate 101.

The writing unit 150 includes an electron lens barrel 102 and a writing chamber 103. In the electron lens barrel 102, there are arranged an electron gun assembly 201, an illumination lens 202, a first aperture plate 203, a projection lens 204, a deflector 205, a second aperture plate 206, an objective lens 207, and a deflector 208. In the writing chamber 103, there is movably arranged an XY stage 105, on which the substrate 101 equipped with a substrate cover 10 is arranged. Although not illustrated, the substrate 101 is earth connected to the writing apparatus 100 through the substrate cover 10. In the interface 120, a transfer robot 122 which transfers the substrate 101 is arranged. In the robot chamber 140, a transfer robot 142 which conveys the substrate 101 is arranged.

The vacuum pump 170 exhausts the gas in the robot chamber 140, the alignment chamber 146, and the substrate cover attaching/detaching chamber 148 through a valve 172. Thereby, the inside of the robot chamber 140, the alignment chamber 146, and the substrate cover attaching/detaching chamber 148 is maintained to be vacuum atmosphere. Moreover, the vacuum pump 170 exhausts the gas in the electron lens barrel 102 and the writing chamber 103 through a valve 174. Thereby, the inside of the electron lens barrel 102 and the writing chamber 103 is maintained to be vacuum atmosphere. Moreover, the vacuum pump 170 exhausts the gas in the load lock chamber 130 through a valve 176. Thereby, the inside of the load lock chamber 130 is controlled to be vacuum atmosphere as needed. A gate valve 132 is arranged at the boundary between the interface 120 and the load lock chamber 130, a gate valve 134 is between the load lock chamber 130 and the robot chamber 140, and a gate valve 136 is between the robot chamber 140 and the writing chamber 103. The target object 101 is, for example, an exposure mask substrate used for transferring a pattern onto the wafer. This mask substrate is, for example, a mask blank on which a pattern has not yet been formed.

The control unit 160 includes a control computer 110, a control circuit 112, a memory 61, and storage devices 114 and 116, such as a magnetic disk drive. The control computer 110, the control circuit 112, the memory 61, and the storage devices 114 and 116, such as a magnetic disk drive, are connected with each other through a bus (not illustrated). The writing apparatus 100 is controlled by the control circuit 112 which is controlled by a signal from the control computer 110. According to the content of the controlling, each device in the writing unit 150, the interface 120, the load lock chamber 130, the alignment chamber 146, and the substrate cover attaching/detaching chamber 148 is driven.

In the control computer 110, there are arranged a writing data processing unit 60, a transfer processing unit 62, a measurement processing unit 64, a positional deviation calculation unit 66, a correction processing unit 68, a cover attachment/detachment processing unit 70, and a writing control unit 72. Each function, such as the writing data processing unit 60, the transfer processing unit 62, the measurement processing unit 64, the positional deviation calculation unit 66, the correction processing unit 68, the cover attachment/ detachment processing unit 70, and the writing control unit 72 may be configured by hardware such as an electronic circuit, or by software such as a program executing these functions. Alternatively, it may be configured by a combination of software and hardware. The data input and output to/from the writing data processing unit 60, the transfer processing unit 62, the measurement processing unit 64, the positional deviation calculation unit 66, the correction processing unit 68, the cover attachment/detachment processing unit 70, and the writing control unit 72 and data being calculated are stored in the memory 61 each time.

As described above, FIG. 1 shows a structure necessary for explaining Embodiment 1. It should be understood that other structure elements generally necessary for the writing apparatus 100 may also be included.

Figure 2:
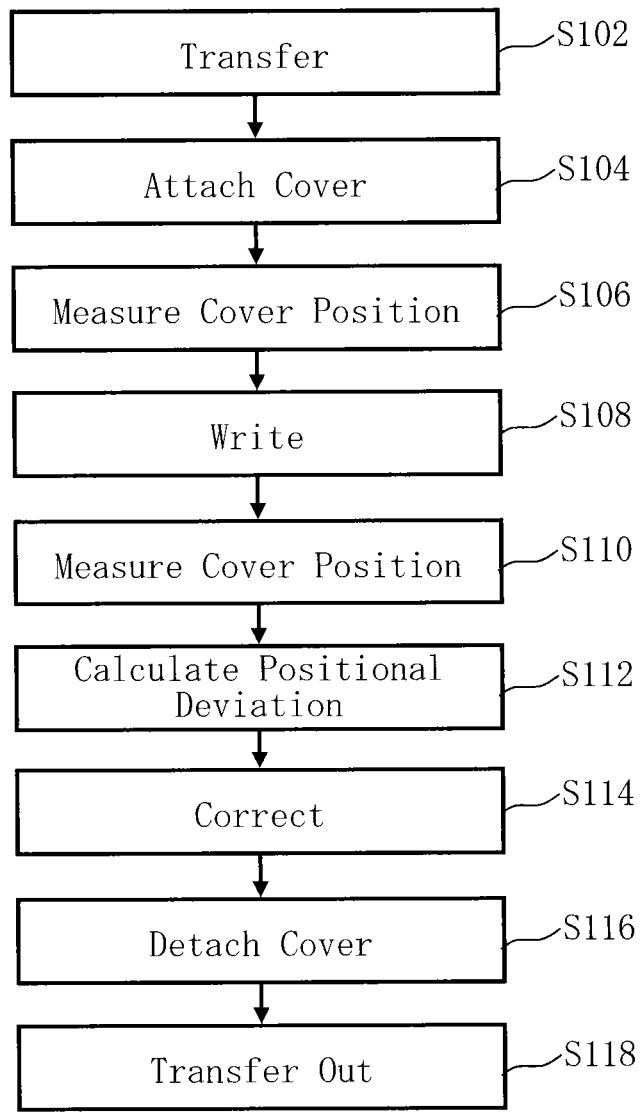
FIG. 2 is a flowchart showing main steps of a writing method according to Embodiment 1.

FIG. 2 is a flowchart showing main steps of a writing method according to Embodiment 1. In FIG. 2, the writing method according to Embodiment 1 executes a series of steps: a transfer step (S102), a cover attachment step (S104), a cover position measurement step (S106), a writing step (S108), a cover position measurement step (S110), a positional deviation calculation step (S112), a correction step (S114), a cover detachment step (S116), and a transfer-out step (S118).

Figure 3:
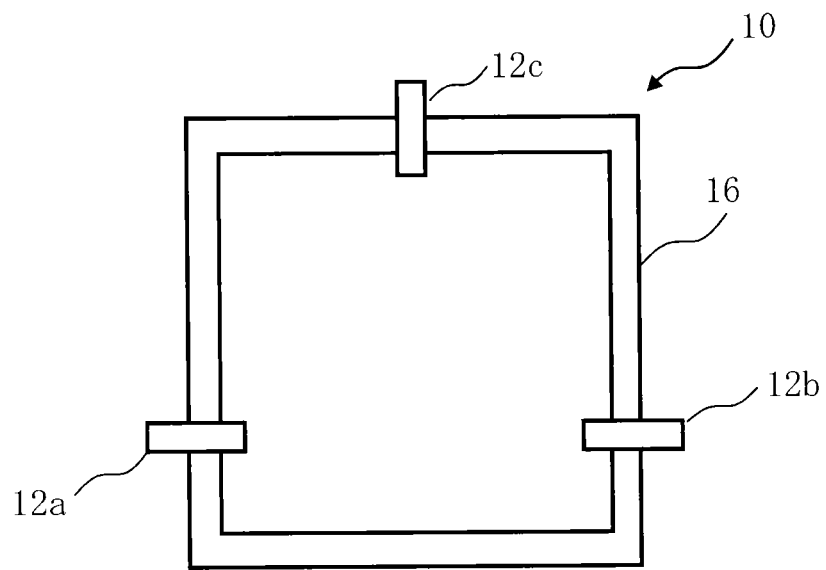
FIG. 3 shows a top view of a substrate cover according to Embodiment 1.
Figure 4:
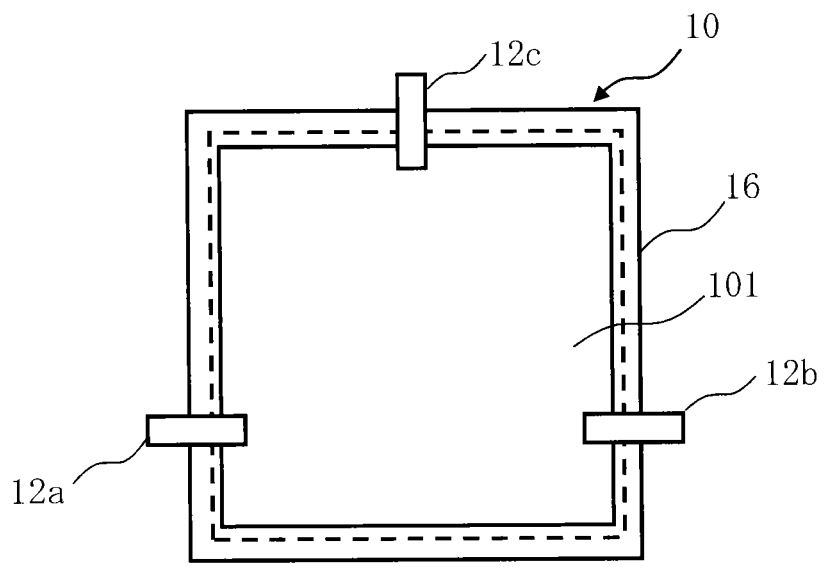
FIG. 4 shows a top view illustrating a state in which the substrate cover of FIG. 3 is attached to a substrate.
Figure 5:
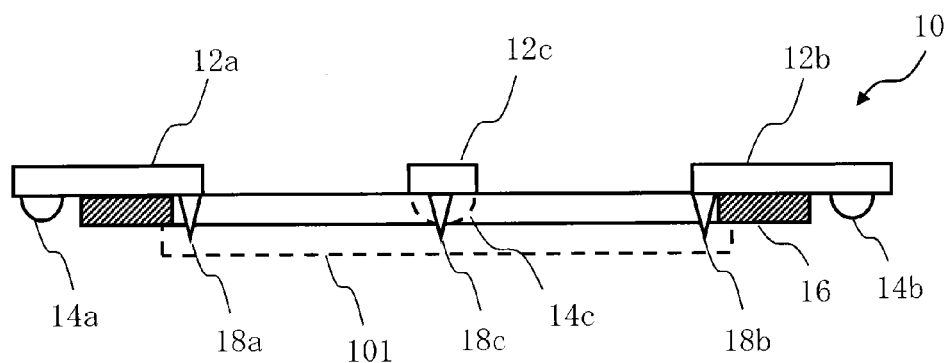
FIG. 5 shows a sectional view of the substrate cover of FIG. 3.

FIG. 3 shows a top view of the substrate cover according to Embodiment 1. FIG. 4 shows a top view illustrating a state in which the substrate cover of FIG. 3 is attached to the substrate. FIG. 5 shows a sectional view of the substrate cover of FIG. 3.

The substrate cover 10 includes three contact support members 12 and a frame 16 (an example of a frame-like member). The contact support members 12 are fixed to the positions supporting the substrate cover 10 by three-point support, from the upper side of the frame 16. The contact support members 12 are fixed such that their ends protrude more inward than the inner peripheral end of the frame 16 and protrude more outward than the outer peripheral end of the frame 16. The contact support members 12 are fixed to the frame 16 by screw clamping or welding, for example. At the backside of each contact support member 12, a pin 18 serving as a contact member is arranged, with its apex facing the backside, at the position more inward than the inner peripheral end of the frame 16. Moreover, at the backside side of each contact support member 12, a hemispherical convex portion 14 is arranged such that its spherical surface faces the outside at the position more outward than the outer peripheral end of the frame 16.

The frame 16 is configured by a plate, and formed such that its peripheral dimension is larger than the outer peripheral end of the substrate 101, and the dimension of the opening, which is at the central part of the inner side, is smaller than the outer peripheral end of the substrate 101. That is, as shown in FIG. 4, it is structured such that when the substrate cover 10 is placed from the upper side to cover the substrate 101, the whole periphery of the outer peripheral part of the substrate 101 shown in a dotted line overlaps with the frame 16. Thus, the substrate cover 10 covers the whole periphery of the substrate 101 from the upper part. When the substrate cover 10 is attached to the substrate 101, the three pins 18 cut into the film formed on the substrate 101, and electrically connect to the conductive film also formed on the substrate 101.

It is preferable for the substrate cover 10 to be formed of entirely conductive material, or of entirely insulating material except for its surface coated by conductive material. Metal, such as copper (Cu), titanium (Ti), or its alloy, etc. is suitable for the conductive material, and ceramic, such as alumina, etc. is suitable for the insulating material.

In the transfer step (S102), the transfer processing unit 62 performs transfer processing of the substrate 101 arranged at the interface 120.

Figure 6:
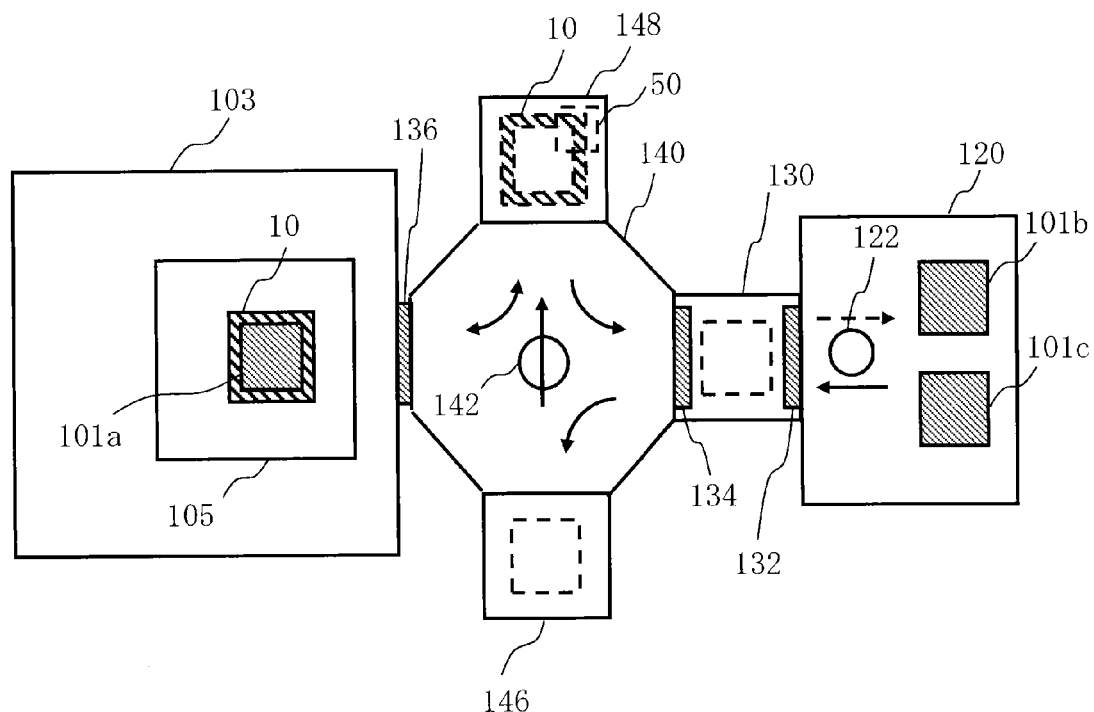
FIG. 6 is a schematic diagram of a top view showing a transfer route in a writing apparatus according to Embodiment 1.
Figure 7:
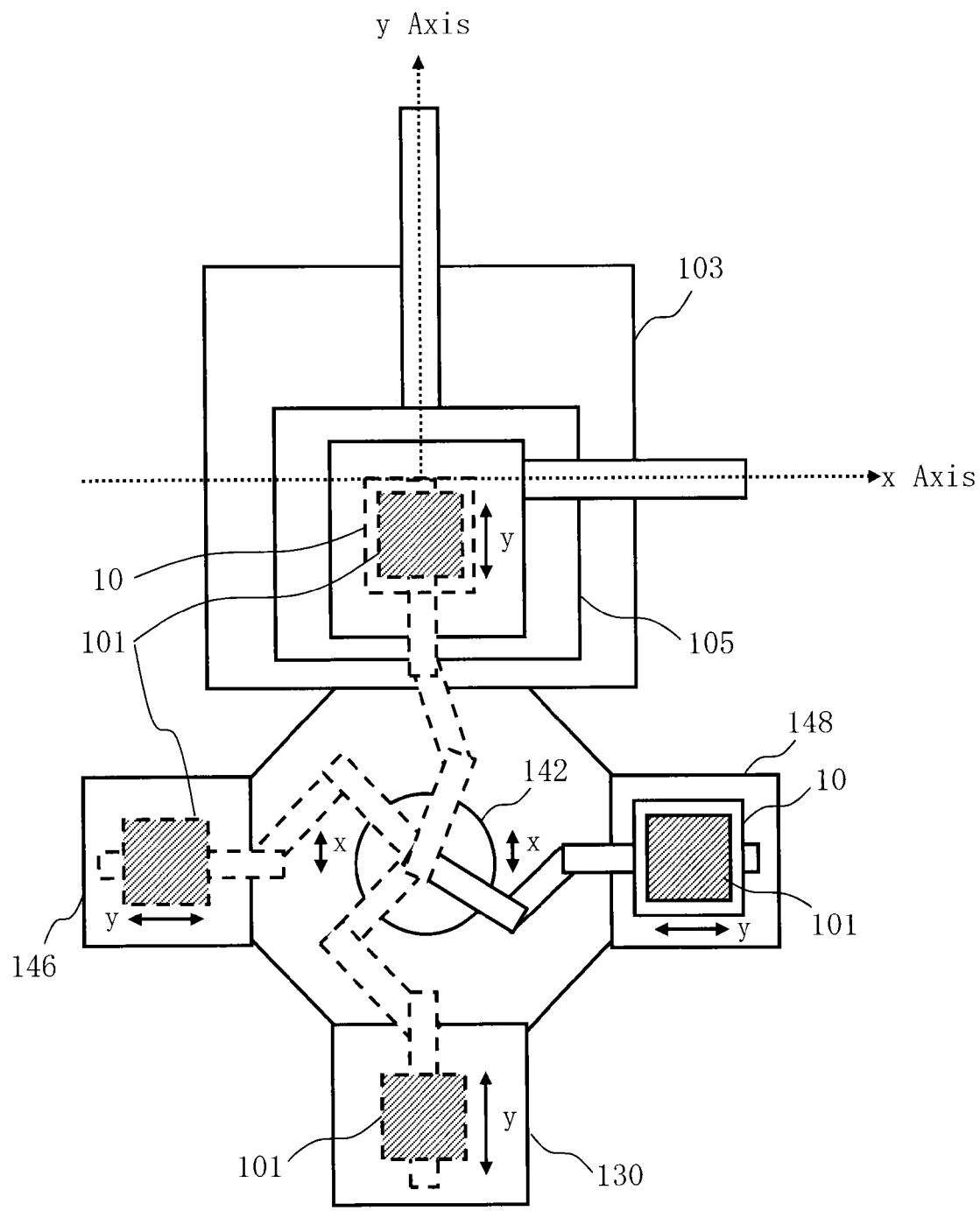
FIG. 7 is a schematic diagram explaining a transfer by a transfer robot according to Embodiment 1.

FIG. 6 is a schematic diagram of a top view showing a transfer route in the writing apparatus according to Embodiment 1. FIG. 7 is a schematic diagram explaining a transfer by the transfer robot according to Embodiment 1.

After the gate valve 132 is open, the substrate 101 arranged at the interface 120 is conveyed onto the support member in the L/L chamber 130 by the transfer robot 122. Then, after the gate valve 132 is closed, the gate valve 134 is opened to transfer the substrate 101 to the stage in the alignment chamber 146 through the robot chamber 140 by the transfer robot 142. Alignment is performed for the substrate 101 in the alignment chamber 146. The substrate 101 for which alignment has been performed is conveyed onto the substrate cover attachment/detachment mechanism in the substrate cover attaching/detaching chamber 148, through the robot chamber 140, by the transfer robot 142. In addition to the alignment, it is preferable to perform isothermal treatment for the substrate 101 in the alignment chamber 146.

The cover attachment/detachment processing unit 70 controls the substrate cover attachment/detachment mechanism. In the cover attachment step (S104), the substrate cover attachment/detachment mechanism attaches the substrate cover 10, which covers the whole periphery of the substrate 101 being a writing target from the upper part, to the substrate 101 having been conveyed on the substrate cover attachment/detachment mechanism.

Figure 8A:
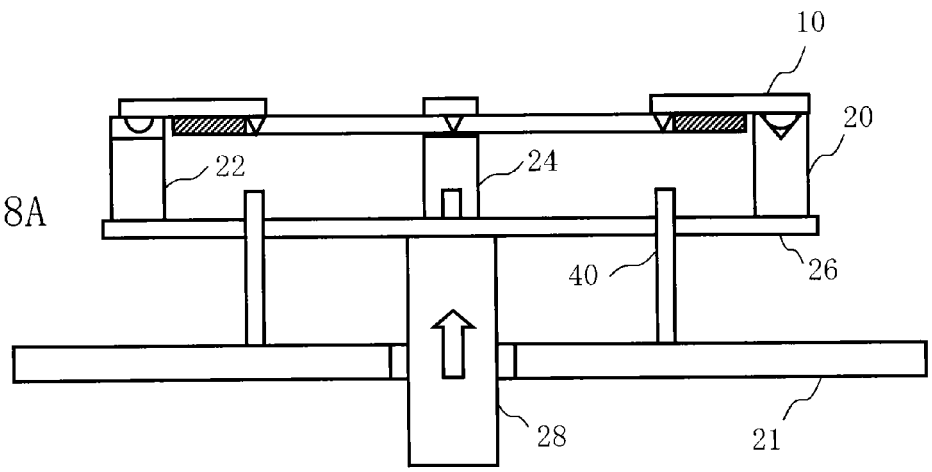
FIGS. 8A to 8C are schematic diagrams showing a structure and operations of a substrate cover attachment/detachment mechanism according to Embodiment 1.
Figure 8B:
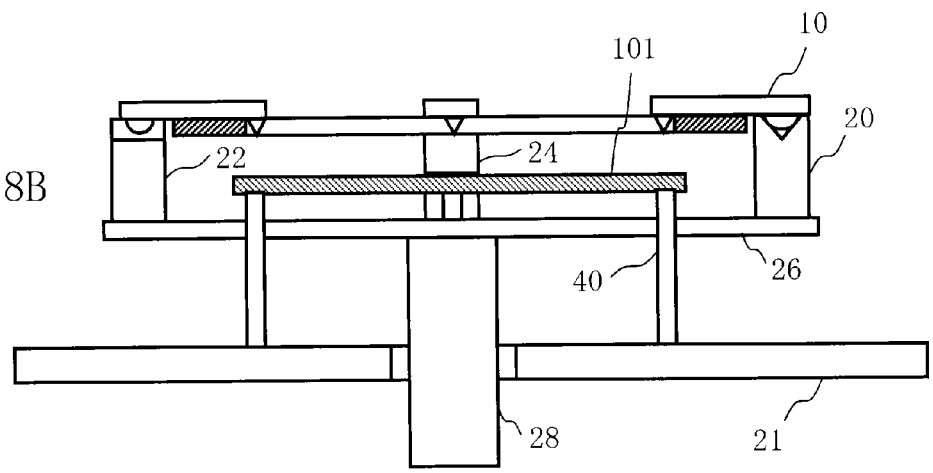
Figure 8C:
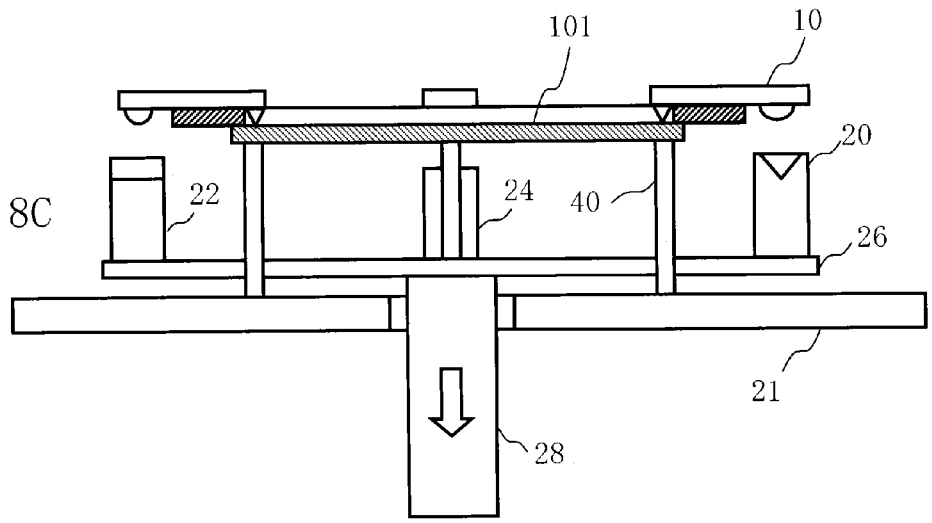

FIGS. 8A to 8C are schematic diagrams showing a structure and operations of the substrate cover attachment/detachment mechanism according to Embodiment 1. In FIG. 8A, a substrate cover attachment/detachment mechanism 30 (substrate cover attachment/detachment unit) includes three alignment support bar members 20, 22, and 24, an elevating table 26, an elevating shaft 28, a pedestal 21, and three substrate support bar pins 40. The substrate cover attachment/detachment mechanism 30 attaches and detaches the substrate cover 10, which covers the whole periphery of the substrate being a writing target from the upper part, to/from the substrate 101. The substrate cover attachment/detachment mechanism 30 is arranged in the substrate cover attaching/detaching chamber 148. The three alignment support members 20, 22, and 24 are fixed on the elevating table 26. The backside of the elevating table 26 is supported by the elevating shaft 28. The elevating shaft 28 is up and down movably arranged, and the alignment support members 20, 22, and 24 move up and down with the movement of the elevating shaft 28. The three substrate support pins 40 are fixed on the pedestal 21. An opening is formed in the elevating table 26 so that it may not contact with the three substrate support pins 40. The three alignment support members 20, 22, and 24 are arranged at the positions where the three convex portions 14 of the substrate cover 10 can be placed respectively. The substrate cover attachment/detachment mechanism 30 supports the substrate cover 10 by coming into contact against the three convex portions 14. The three substrate support pins 40 are arranged at the positions where the backside of the substrate 101 is three-point supported.

FIGS. 9A to 9F are schematic diagrams showing the shapes of the upper surfaces of three alignment support members according to Embodiment 1. FIG. 9A shows a top view and FIG. 9B shows a front sectional view of the alignment support member 20. A conical groove portion is formed in the upper surface of the alignment support member 20. FIG. 9C shows a top view and FIG. 9D shows a front sectional view of the alignment support member 22. A V-shaped groove portion is formed in the upper surface of the alignment support member 22. FIG. 9E shows a top view and FIG. 9F shows a front sectional view of the alignment support member 24. A plane portion is formed at the upper surface of the alignment support member 24. The hemispherical convex portion 14 of the substrate cover 10 is placed on each alignment support members 20, 22, and 24. The alignment support members 20, 22, and 24 perform alignment of the substrate cover 10 by the self-weight of the placed substrate cover 10. That is, positioning is performed to determine a certain position by the movement of one convex portion 14 moving along the inclination of the conical groove portion. Moreover, positioning is performed by the movement of another convex portion 14 moving in one planar direction, due to the inclination of the V-shaped groove portion. Then, the remaining one convex portion 14 becomes free with respect to the planar direction on the plane portion. Therefore, the position can be determined based on the point positioned by the conical groove portion. Moreover, as shown in FIGS. 9A to 9F, the height of the upper surface of the alignment support member 24 is formed such that it is in accordance with the height at the time of the convex portion 14 being laid on the other two alignment support members 20 and 22. Here, it is preferable that the inclination angle θ, with respect to the Z axis, of the conical groove portion and the V-shaped groove portion is set to satisfy $\sin θ \times \cos θ > 2μ$ by using a maximum static friction coefficient μ between the alignment support members 20, 22, and 24 and the convex portion 14.

FIG. 8A shows the step before the substrate 101 is transferred into the substrate cover attaching/detaching chamber 148. In this step, the substrate cover 10 is in the state supported in the substrate cover attachment/detachment mechanism 30, and as described above, alignment of the substrate cover 10 has been performed by the self-weight of the substrate cover 10. Moreover, in this step, in preparation of carry-in of the substrate 101, the elevating shaft 28 goes up, and thereby, the substrate cover 10 supported by the three alignment support members 20, 22, and 24 is arranged to be upper than the arrangement position of the substrate 101.

Then, in such a state, the substrate 101 is transferred by the transfer robot 142 onto the three substrate support pins 40 of the substrate cover attachment/detachment mechanism 30 as shown in FIG. 8B. Next, as shown in FIG. 8C, the substrate cover 10 is laid on the substrate 101 by lowering the elevating shaft 28. The lowering is performed until the three alignment support members 20, 22, and 24 are located lower than the convex portion 14 so that the substrate 101 to which the substrate cover 10 has been attached may be taken out. Then, the transfer robot 142 inserts its own arm into the backside lower part of the substrate 101 in order to lift the substrate 101 to which the substrate cover 10 has been attached.

In the cover position measurement step (S106), before writing a pattern on the substrate 101, the measurement processing unit 64 controls a measurement mechanism 50 to measure the position of the substrate cover 10 in the state attached to the substrate 101, at a predetermined measurement position. The measurement mechanism 50 for measuring the position of the substrate cover 10 is arranged in the substrate cover attaching/detaching chamber 148. Before writing a pattern on the substrate 101, the measurement mechanism 50 measures the position of the substrate cover 10 in the state attached to the substrate 101, at a predetermined measurement position. The measurement frame 50 is an example of the position measurement unit. The position of the substrate cover 10 is measured after the substrate cover 10 has been released from the support of the three alignment support members 20, 22, and 24. For example, as shown in FIG. 8C, the position of the substrate cover 10 is measured in the state where the elevating shaft 28 has been lowered, the alignment support members 20, 22, and 24 have been away from the substrate cover 10 and the substrate 101 equipped with the substrate cover 10 has been supported by the three substrate support pins 40. Alternatively, the position of the substrate cover 10 may be measured in the state where the substrate 101 equipped with the substrate cover 10 is supported by the arm (robot hand) of the transfer robot 142. In such a case, for example, measuring is performed at the position where the substrate 101 to which the substrate cover 10 has been attached is lifted from the substrate cover attachment/detachment mechanism 30 by the arm (robot hand) of the transfer robot 142.

Figure 10:
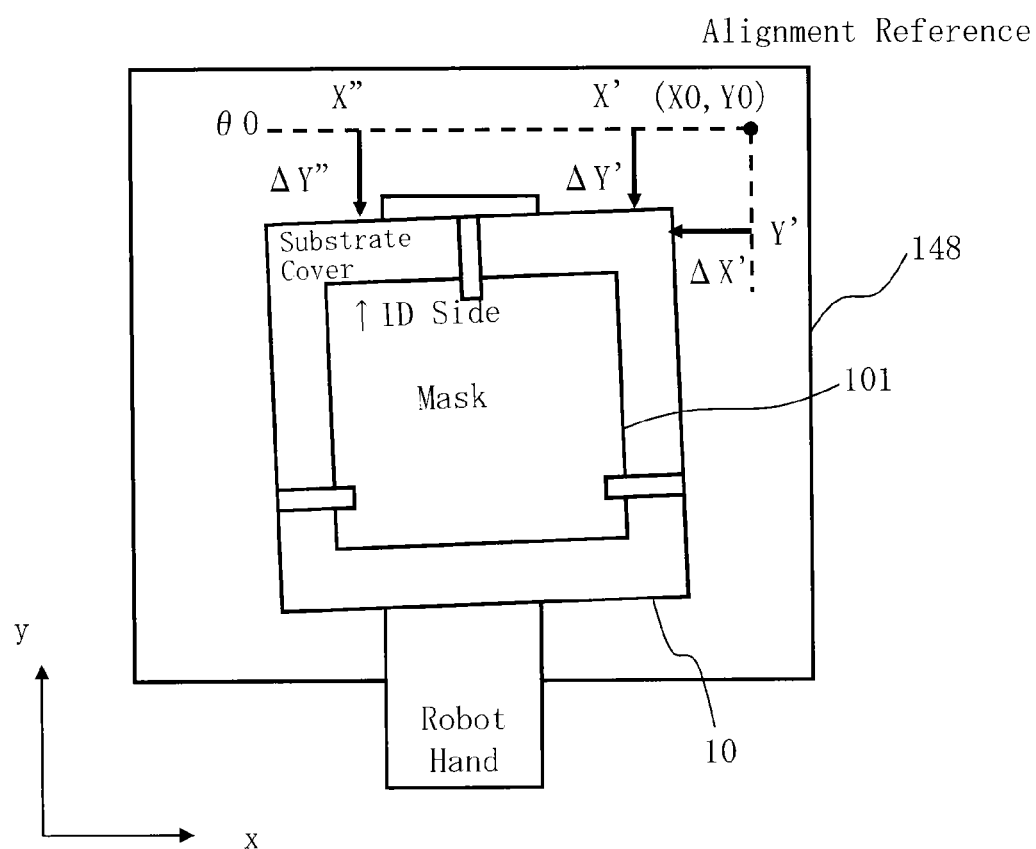
FIG. 10 is a schematic diagram explaining an example of a method of measuring the position of a substrate cover according to Embodiment 1.

FIG. 10 is a schematic diagram explaining an example of a method of measuring the position of the substrate cover according to Embodiment 1. In FIG. 10, the position of the substrate cover 10 is obtained by measuring ΔY' which is a distance in the Y direction from the reference position (X0, Y0) to the end surface of the substrate cover 10 at the position X', ΔY" which is a distance in the Y direction from the reference position (X0,Y0) to the end surface of the substrate cover 10 at the position X", and ΔX' which is a distance in the X direction from the reference position (X0,Y0) to the end surface of the substrate cover 10 at the position Y'. Based on the position information of these three points, the x position (x1), the y position (y1), and the rotation position (θ1) of the substrate cover 10 in the measurement coordinate system can be measured. Although the positions X' and X" are positions at both the sides supported by the robot hand of the transfer robot 142 in the example of FIG. 10, it is not limited thereto. Both the positions of X' and X" may be closer to the reference position side than the robot hand of the transfer robot 142, or may be closer to the opposite side. Here, although (x1, y1, e1) are calculated as the position of the substrate cover 10, it is not limited thereto. What is needed is to obtain at least the x position and the y position (x1, y1) according to Embodiment 1. The position information on the substrate cover 10 measured before performing writing is stored (memorized) in the storage device 116.

Figure 11:
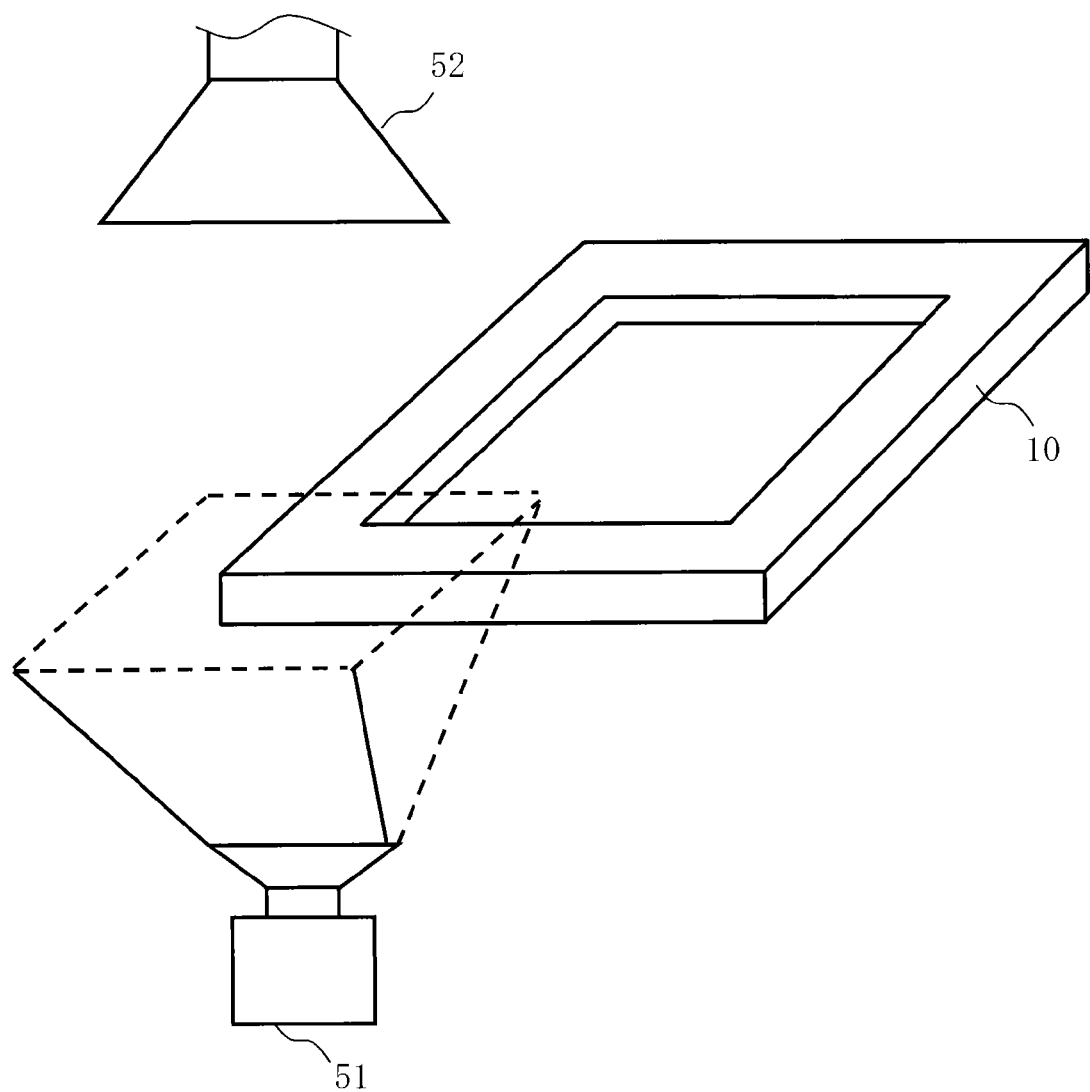
FIG. 11 is a schematic diagram showing an example of a measurement mechanism according to Embodiment 1.

FIG. 11 is a schematic diagram showing an example of a measurement mechanism according to Embodiment 1. In FIG. 11, the measurement mechanism 50 includes a camera 51 and an illuminating device 52. Under the control of the measurement processing unit 64, for example, the camera 51 captures an image from the lower part side such that one of the four corners of the substrate cover 10 illuminated from the upper part by the illuminating device 52 is to be in the imaging range. It is preferable to use a CCD camera as the camera 51, for example. Not only CCD, but other type camera may also be used. The relation of the arrangement position of the camera 51 and the illuminating device 52 may be inverted. Captured image data is output to the measurement processing unit 64. The measurement processing unit 64 calculates the position of the substrate cover 10 using the image data. Specifically, ΔY', ΔY" and ΔX' are measured. ΔY' is a distance in the Y direction from the position, which is from the reference position (X0,Y0) by X', to the substrate cover 10, ΔY" is a distance in the Y direction from the position, which is from the reference position (X0,Y0) by X", to the substrate cover 10, and ΔX' is a distance in the X direction from the position, which is from the reference position (X0,Y0) by Y', to the substrate cover 10.

Figure 12:
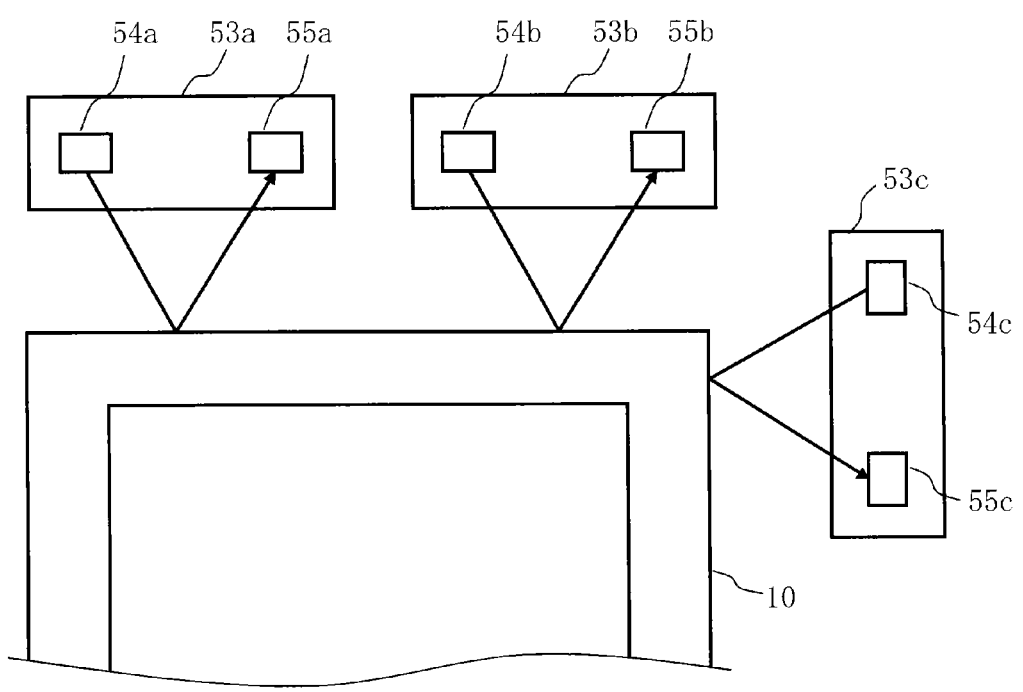
FIG. 12 is a schematic diagram showing another example of the measurement mechanism according to Embodiment 1.

FIG. 12 is a schematic diagram showing another example of the measurement mechanism according to Embodiment 1. In FIG. 12, the measurement mechanism 50 includes a plurality of displacement sensors 53. In this case, three displacement sensors 53a, 53b, and 53c are arranged. Specifically, they are respectively arranged at a position from the reference position (X0,Y0) by a distance X' in the X direction, a position from the reference position (X0,Y0) by a distance X" in the X direction, and a position from the reference position (X0,Y0) by a distance Y' in the Y direction. Then, the distances from each of these three positions to the end surface of the substrate cover 10 are measured. The three displacement sensors 53a, 53b, and 53c can measure positions respectively by utilizing that a laser emitted from a laser generator 54 is reflected at the end surface of the substrate cover 10 and the reflected light is received by a photoreceiver 55. Obtained position data is output to the measurement processing unit 64. Then, the measurement processing unit 64 calculates the position of the substrate cover 10 by using the position data.

Then, after the gate valve 136 is opened, the substrate 101, to which the substrate cover 10 whose position was measured has been attached, is conveyed onto the XY stage 105 in the writing chamber 103 by the transfer robot 142. Then, after the gate valve 136 is closed, a predetermined pattern is written on the substrate 101 on the XY stage 105.

In the writing step (S108), in the state where the substrate cover 10 has been attached to the substrate 101, the writing unit 150 writes a pattern on the substrate 101 by using an electron beam 200. Specifically, first, the writing data processing unit 60 reads writing data from the storage device 114, and performs data conversion processing of a plurality of steps to generate shot data unique to the apparatus. The writing control unit 72 controls the control circuit 112 based on the shot data, so as to drive the writing unit 150. The following operations are to be performed in the writing unit 150.

The electron beam 200 emitted from the electron gun 201 being an example of an illumination unit irradiates the entire first aperture plate 203 having a quadrangular opening by the illumination lens 202. At this point, the electron beam 200 is shaped to be a quadrangle. Then, after having passed through the first aperture plate 203, the electron beam 200 of a first aperture image is projected onto the second aperture plate 206 by the projection lens 204. The position of the first aperture image on the second aperture plate 206 is deflection-controlled by the deflector 205 so as to change the shape and size of the beam to be variably shaped. Consequently, the electron beam 200 is variably shaped per shot each time. After having passed through the second aperture plate 206, the electron beam 200 of a second aperture image is focused by the objective lens 207 and deflected by the main deflector 208, and reaches a desired position on the substrate 101 on the XY stage 105 which moves continuously. According to the operations described above, irradiation is performed by the electron beam 200 of a plurality of shots and a desired pattern is written by connecting shot figures formed by each shot.

After finishing the writing, the gate valve 136 is opened so that the substrate 101, to which the substrate cover 10 has been attached, can be transferred from the XY stage 105 in the writing chamber 103 into the robot chamber 140 by the transfer robot 142. After the gate valve 136 is closed, the substrate 101 is transferred into the substrate cover attaching/detaching chamber 148. Here, if the substrate cover 10 is detached from the substrate 101 in the state where the substrate 101 with the substrate cover 10 is mounted on the substrate cover attachment/detachment mechanism 30, the scratching mentioned above occurs. Thus, according to Embodiment 1, it operates as follows:

In the cover position measurement step (S110), after writing a pattern on the substrate 101, the measurement mechanism 50 under the control of the measurement processing unit 64 again measures the position of the substrate cover 10 in the state attached to the substrate 101, at the same position as the predetermined measurement position used to measure before the writing. Here, the position of the substrate cover 10 is measured before the substrate cover 10 is supported by the three alignment support members 20, 22, and 24. For example, as shown in FIG. 8C, it is measured in the state where the elevating shaft 28 is at the lowered position and the substrate 101 equipped with the substrate cover 10 is supported by the three substrate support pins 40. Alternatively, it may be measured in the state where the substrate 101 to which the substrate cover 10 has been attached is supported by the arm (robot hand) of the transfer robot 142. In that case, for example, the measuring is performed at the position where the substrate 101 equipped with the substrate cover 10 has been transferred (conveyed) to the upper part of the substrate cover attachment/detachment mechanism 30 by the arm (robot hand) of the transfer robot 142. The method of measuring the position of the substrate cover 10 is the same as the measuring method before writing. Thereby, the position (x2, y2, θ2) of the substrate cover 10 after writing can be obtained. Similarly to the measuring before writing, what is needed is to obtain at least x position and y position (x2,y2). The position information on the substrate cover 10 measured after writing is stored (memorized) in the storage device 116. According to the method described above, positions of the substrate cover 10 before and after writing supported at the same position in the middle of the transferring are obtained. In other words, it is possible to obtain the position of the substrate cover 10 for which alignment has been performed by the substrate cover attachment/detachment mechanism 30 and the position of the substrate cover 10 just before for which alignment is again performed by the substrate cover attachment/detachment mechanism 30.

In the positional deviation calculation step (S112), with respect to the position of the substrate 101 to which the substrate cover 10 has been attached, the positional deviation calculation unit 66 calculates a positional deviation amount (Δx, Δy, Δθ) between the measured position (x2, y2, θ2) of the substrate cover 10 measured after writing and the measured position (x1, y1, θ1) of the substrate cover 10 measured before writing. What is needed for this calculation is to calculate a difference of each element. That is, what is necessary is just to calculate Δx=x2−x1, Δy=y2−y1, and Δθ=θ2−θ1, respectively. As described above, it should be understood that if the position information on the substrate cover 10 is only about the x and y positions, it is sufficient to calculate a positional deviation amount (Δx,Δy).

In the correction step (S114), under the control of the correction processing unit 68, the transfer robot 142 corrects the calculated positional deviation amount (Δx,Δy) with respect to the position of the substrate 101 to which the substrate cover 10 has been attached. The correction of the positional deviation amount (Δx,Δy) is performed by controlling the position of the arm of the transfer robot 142. Specifically, it is controlled as follows: For example, as shown in FIG. 8C, in the case that the position of the substrate cover 10 was measured in the state where the elevating shaft 28 had been at the lowered position and the substrate 101 equipped with the substrate cover 10 had been supported by the three substrate support pins 40, the substrate 101 equipped with the substrate cover 10 is once lifted by the arm (robot hand) of the transfer robot 142. Then, the correction processing unit 68 controls the transfer robot 142 to correct the position of the substrate 101 to be placed on the substrate cover attachment/detachment mechanism 30 by the positional deviation amount (Δx,Δy). For example, when the position of the substrate cover 10 was measured in the state where the substrate 101 equipped with the substrate cover 10 had been supported by the arm (robot hand) of the transfer robot 142, the transfer robot 142 corrects, under the control of the correction processing unit 68, the position of the substrate 101 to be placed on the substrate cover attachment/detachment mechanism 30 by the positional deviation amount (Δx,Δy) while keeping the supported state by the arm of the transfer robot 142. The transfer robot 142 is an example of a correction unit or a first correction unit. As described above, the transfer robot 142 corrects the positional deviation amount with respect to the X direction and the Y direction. Thereby, it is possible to make the position of the substrate cover 10 at the time of being placed on the substrate cover attachment/detachment mechanism 30 be close to the position of the substrate cover 10 before writing.

In the cover detachment step (S116), after the positional deviation having been corrected, the cover attachment/detachment processing unit 70 detaches the substrate cover 10 from the substrate 101. Specifically, it operates as follows: First, the transfer robot 142 mounts the substrate 101 equipped with the substrate cover 10 on the three substrate support pins 40, at the corrected position, with keeping the elevating shaft 28 at the lowered position as shown in FIG. 8C. In such a state, the substrate cover 10 is detached from the substrate 101 by raising the elevating shaft 28 as shown in FIG. 8B.

Figure 13:
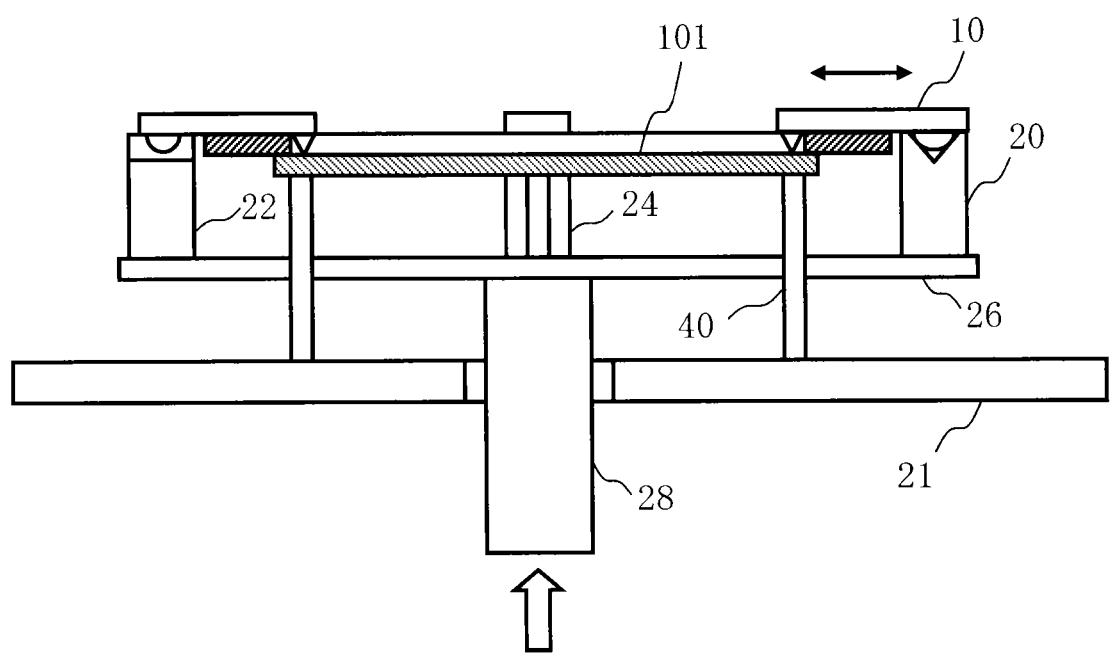
FIG. 13 is a schematic diagram explaining a comparative example in the case of not correcting the position of the substrate cover of Embodiment 1.

FIG. 13 is a schematic diagram explaining a comparative example in the case of not correcting the position of the substrate cover of Embodiment 1. In FIG. 13, when the position of the substrate cover 10 is not corrected before and after writing, the position of the substrate cover 10 may be shifted before and after the writing. If, in this state, the elevating shaft 28 is raised to contact the alignment support members 20, 22, and 24 with the substrate cover 10, an alignment operation is started when the substrate cover 10 starts to contact with the alignment support members 20, 22, and 24. Then, the substrate cover 10 moves (slides laterally) in the planar direction in order to perform position alignment. As a result, the substrate cover 10 and the substrate 101 slide with each other, thereby scratching the substrate.

Compared with the case of not correcting the position as described above, according to Embodiment 1, the position of the substrate cover 10 after correction is closer to the position where alignment was performed before writing by the three alignment support members 20, 22, and 24. Therefore, even if the substrate cover 10 starts contacting with the alignment support members 20, 22, and 24 because the elevating shaft 28 is raised, the substrate cover 10 does not move (slide laterally) in the planar direction. Alternatively, even if the moving (sliding laterally) occurs, the movement amount will be small. Therefore, the sliding between the substrate cover 10 and the substrate 101 can be inhibited or reduced. As a result, it is possible to inhibit or reduce scratching of the substrate 101 due to the sliding.

Figure 14A:
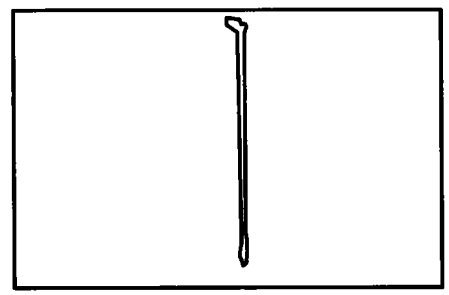
FIGS. 14A and 14B are for explaining an effect of the position correction according to Embodiment 1.
Figure 14B:
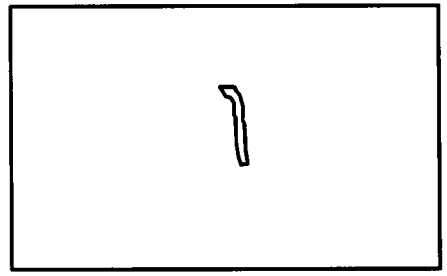

FIGS. 14A and 14B are for explaining an effect of the position correction according to Embodiment 1. FIG. 14A shows an example of scratching in the case of detaching the substrate cover 10 by the substrate cover attachment/detachment mechanism 30 without correcting the position of the substrate cover 10. On the other hand, as shown in FIG. 14B, the scratch size can be greatly reduced by performing position correction of the substrate cover 10 according to Embodiment 1.

Moreover, according to Embodiment 1, the support table for supporting the substrate cover 10 and the support table for alignment of the substrate cover 10 are configured by the same three alignment support members 20, 22, and 24. Therefore, compared with the case where the support table for supporting the substrate cover 10 and the support table for alignment of the substrate cover 10 are separately provided, it is possible to suppress the risk of generating particles. As described above, the substrate cover 10 is detached from the substrate 101 in the substrate cover attaching/detaching chamber 148 by the substrate cover attachment/detachment mechanism 30.

In the transfer-out step (S118), the substrate 101 from which the substrate cover 10 has been detached is transferred out by the transfer processing unit 62. Specifically, first, the arm of the transfer robot 142 is inserted into the backside side of the substrate 101 from which the substrate cover 10 has been detached to lift the substrate 101. Then, by pulling back the arm which is supporting the substrate 101, the substrate 101 is conveyed to the robot chamber 140. After the gate valve 134 is opened, the substrate 101 is transferred to the stage in the load lock chamber 130 by the transfer robot 142. Then, after the gate valve 134 is closed, the gate valve 132 is opened to transfer the substrate 101 to the interface 120 by the transfer robot 122.

In the case of the degree of vacuum in each chamber falling during the transfer-out operation described above, the vacuum pump 170 is operated each time of the fall in order to maintain the vacuum degree. Alternatively, it is also acceptable to maintain a desired vacuum degree by opening or closing the valve 172 or the valve 174 and performing vacuuming using the vacuum pump 170 under operation.

As described above, according to Embodiment 1, it is possible to inhibit scratching the substrate and generating particles.

Embodiment 2

In Embodiment 1, position correction of the substrate cover 10 is performed with respect to the X and Y directions. In Embodiment 2, the case of further performing correction with respect also to a rotation direction position θ will be described. The content except for what is particularly described is the same as that of Embodiment 1 hereafter. The structure of the writing apparatus 100 according to Embodiment 2 is the same as FIG. 1 except for that an isothermal treatment processing chamber 145 is further arranged and, instead of the alignment chamber 146 and the substrate cover attaching/detaching chamber 148, a substrate cover attaching/detaching chamber 147 having the functions of the two chambers 146 and 148 is arranged. The writing apparatus 100 is controlled by the control circuit 112 which is controlled by a signal from the control computer 110. According to the content of the controlling, each device in the writing unit 150, the interface 120, the load lock chamber 130, the isothermal treatment processing chamber 145, and the substrate cover attaching/detaching chamber 147 is driven.

Figure 15:
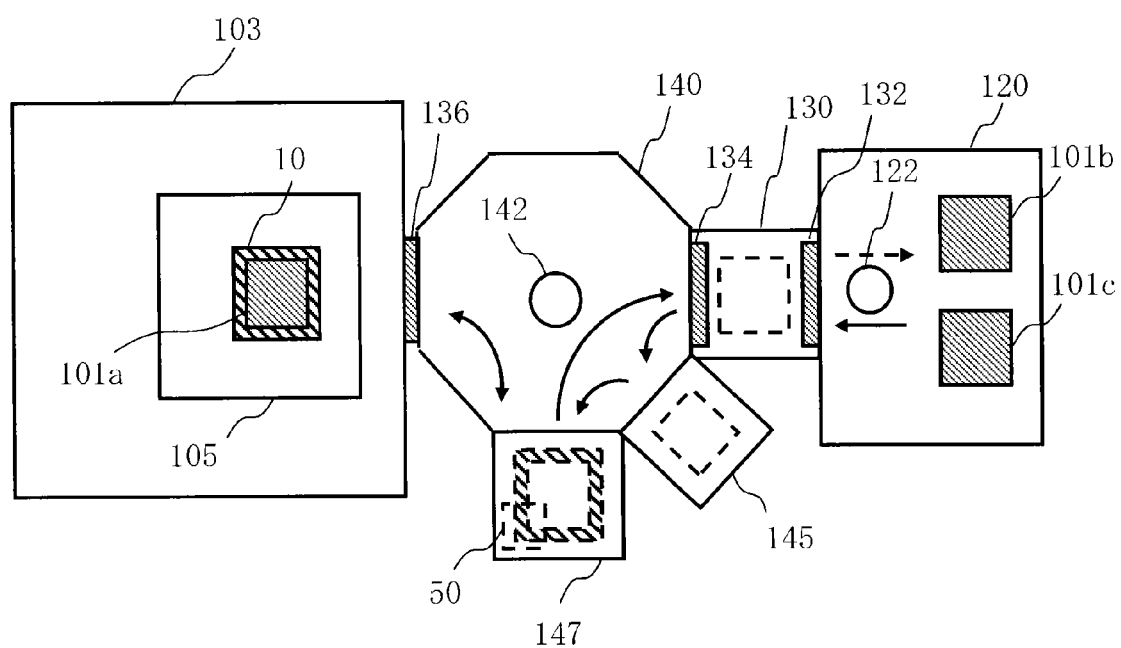
FIG. 15 is a top view schematic diagram showing a transfer route in the writing apparatus according to Embodiment 2.
Figure 16:
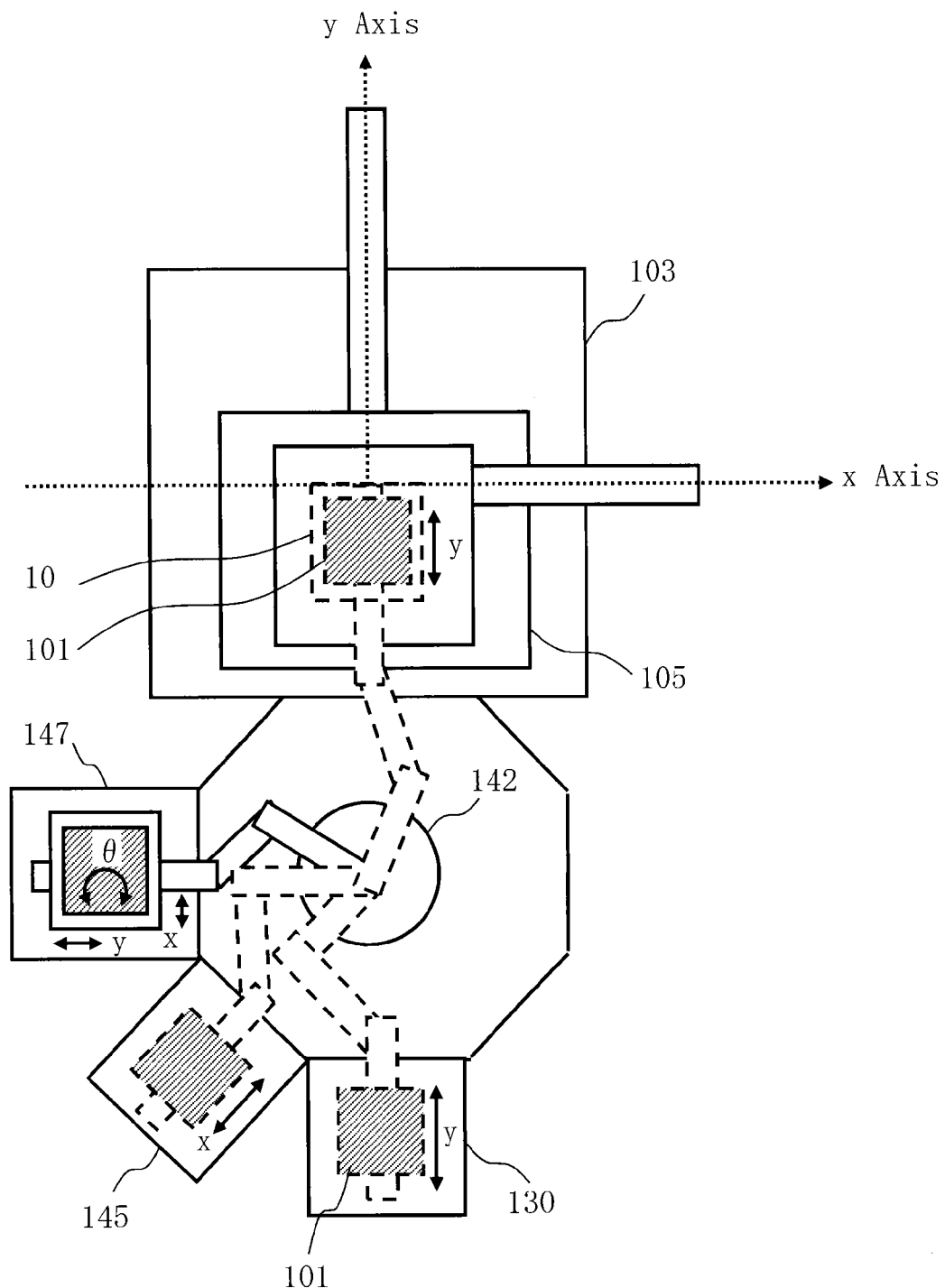
FIG. 16 is a schematic diagram explaining an aspect of transfer by a transfer robot according to Embodiment 2.

FIG. 15 is a top view schematic diagram showing a transfer route in the writing apparatus according to Embodiment 2. FIG. 16 is a schematic diagram explaining an aspect of the transfer by the transfer robot according to Embodiment 2. In FIGS. 15 and 16, the robot chamber 140 is formed in a hexagonal shape seen from the upper side. The L/L chamber 130 and the writing chamber 103 are respectively connected to the hexagon by its two sides facing each other. The substrate cover attaching/detaching chamber 147 is connected to the hexagon at the middle side of the three sides between the two sides connected to the L/L chamber 130 and the writing chamber 103, and for example, arranged at the same position as the alignment chamber 146 in FIG. 6. The isothermal treatment processing chamber 145 is connected to the hexagon at the side between the two sides connected to the L/L chamber 130 and the substrate cover attaching/detaching chamber 147. However, the connecting method is not limited to what is described above. Thus, it is necessary for the L/L chamber 130, the writing chamber 103, the isothermal treatment processing chamber 145, and the substrate cover attaching/detaching chamber 147 to be respectively connected to one of the sides of the hexagon being the robot chamber 140.

In the transfer step (S102), the transfer processing unit 62 performs transfer processing of the substrate 101 arranged at the interface 120. After the gate valve 132 is opened, the substrate 101 arranged at the interface 120 is conveyed by the transfer robot 122 onto the support member in the L/L chamber 130. Then, after the gate valve 132 is closed, the gate valve 134 is opened in order to transfer the substrate 101 onto the stage in the isothermal treatment processing chamber 145 by the transfer robot 142 through the robot chamber 140. Then, isothermal treatment processing is performed for the substrate 101 in the isothermal treatment processing chamber 145.

Next, the substrate 101 for which isothermal treatment processing has been performed is transferred onto the substrate cover attachment/detachment mechanism 50 in the substrate cover attaching/detaching chamber 147 by the transfer robot 142 through the robot chamber 140. In the substrate cover attaching/detaching chamber 147, there is arranged the measurement mechanism 50 for measuring the positions of the substrate 101 and the substrate cover 10. The structure of the measurement mechanism 50 may be the same as that of Embodiment 1.

Figure 17A:
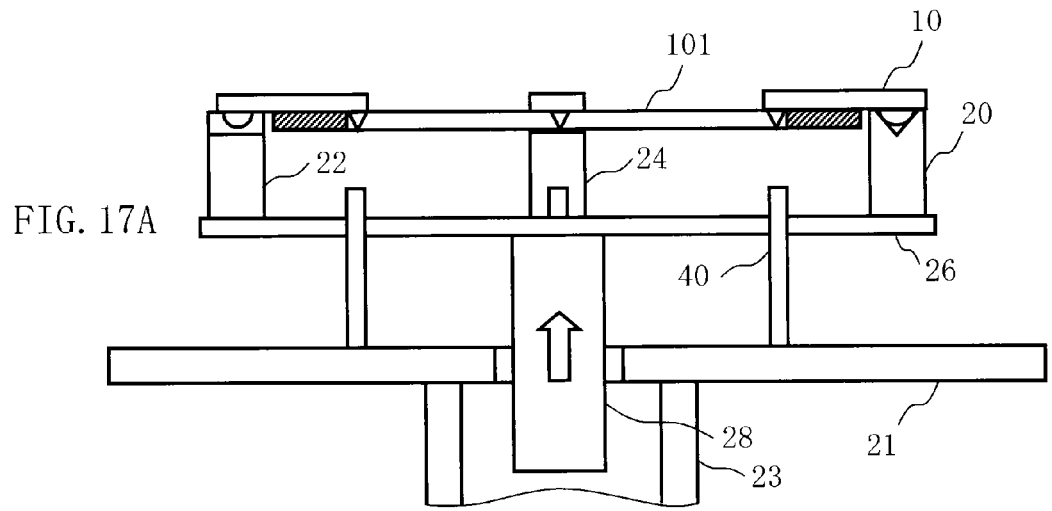
FIGS. 17A to 17C are schematic diagrams showing a structure and operations of the substrate cover attachment/detachment mechanism according to Embodiment 2.
Figure 17B:
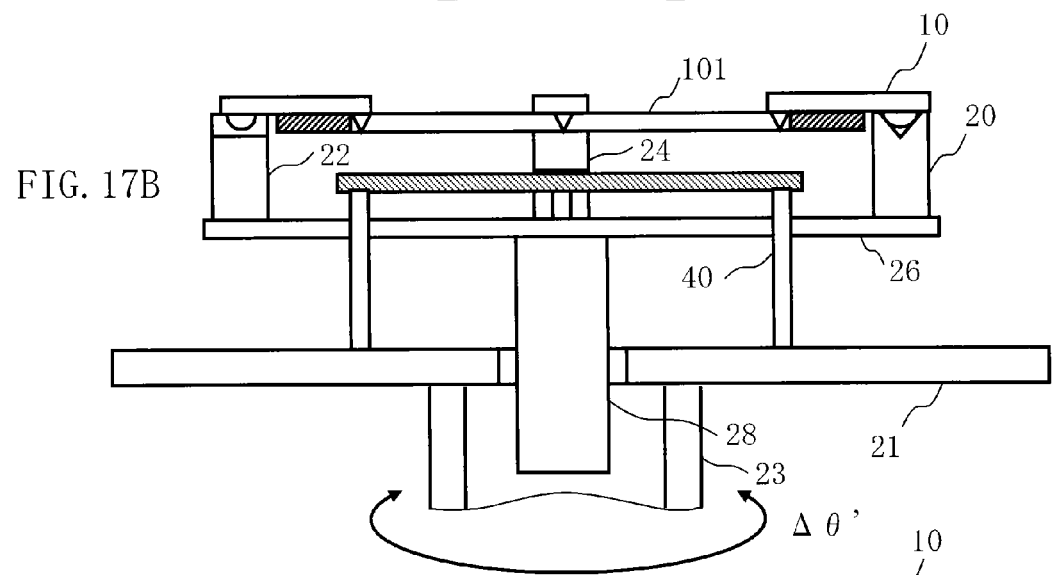
Figure 17C:
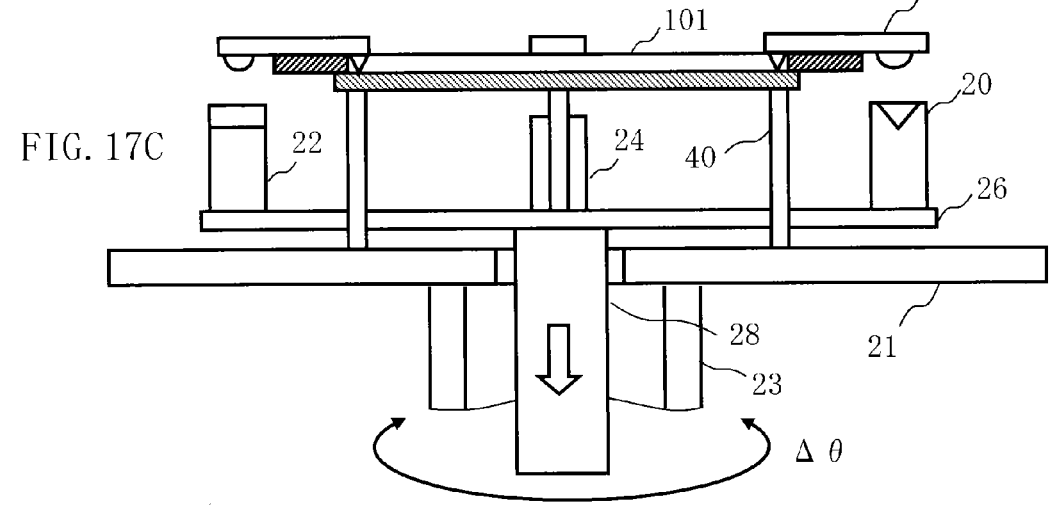

FIGS. 17A to 17C are schematic diagrams showing the structure and operations of the substrate cover attachment/detachment mechanism according to Embodiment 2. FIGS. 17A to 17C are the same as FIGS. 8A to 8C except for that a rotating shaft 23 is connected to the pedestal 21 and is horizontally rotatable centering on the central position of the three substrate support pins 40. The central position of the three substrate support pins 40 is to be the central position of the substrate surface when the substrate 101 is arranged. The shapes of the alignment support members 20, 22, and 24 are the same as those of FIGS. 9A to 9F.

FIG. 17A shows the step before the substrate 101 is conveyed into the substrate cover attaching/detaching chamber 147. In this step, the substrate cover 10 is in the state supported in the substrate cover attachment/detachment mechanism 30, and as described above, alignment of the substrate cover 10 has been performed by the self-weight of the substrate cover 10. Moreover, in this step, in preparation of carry-in of the substrate 101, the elevating shaft 28 goes up, and thereby, the substrate cover 10 supported by the three alignment support members 20, 22, and 24 is arranged to be upper than the arrangement position of the substrate 101.

Then, in such a state, the substrate 101 is transferred onto the three substrate support pins 40 of the substrate cover attachment/detachment mechanism 30 by the transfer robot 142 as shown in FIG. 17B. Here, first, alignment is performed for the substrate 101. Specifically, the alignment processing is performed by measuring the position of the substrate 101 by the measurement mechanism 50, and by adjusting the x and y direction positions by the transfer robot 142 and adjusting (Δθ′) the rotation direction position θ by the rotation of the rotating shaft 23. The measuring method of the position of the substrate cover 10 may be the same as that used when measuring the substrate 101 according to Embodiment 1. The measurement mechanism 50 may be arranged at the position where both the positions of the substrate cover 10 and the substrate 101 can be measured. Alternatively, the measurement mechanism 50 may be arranged to be movable between the measurement position for measuring the position of the substrate cover 10 and the measurement position for measuring the position of the substrate 101.

The cover attachment/detachment processing unit 70 controls the substrate cover attachment/detachment mechanism. In the cover attachment step (S104), the substrate cover attachment/detachment mechanism attaches the substrate cover 10, which covers the whole periphery of the substrate 101 being the writing target from the upper part, to the substrate 101 having been conveyed on the substrate cover attachment/detachment mechanism.

The substrate cover 10 is laid on the substrate 101 by lowering the elevating shaft 28 from the state in which the substrate 101, for which alignment has been performed, is laid on the three substrate support pins 40 as shown in FIG. 17B to the state in which the elevating shaft 28 is lowered as shown in FIG. 17C. The lowering is performed until the three alignment support members 20, 22, and 24 are located lower than the convex portion 14 so that the substrate 101 to which the substrate cover 10 is attached may be taken out. Then, the transfer robot 142 inserts its own arm into the backside lower part of the substrate 101 in order to lift the substrate 101 to which the substrate cover 10 has been attached.

The contents of the cover position measurement step (S106) are the same as those of Embodiment 1. However, according to Embodiment 2, the measurement mechanism 50 under the control of the measurement processing unit 64 calculates (x1, y1, θ1) as the position of the substrate cover 10 before writing. Then, the position information on the substrate cover 10 measured before writing is stored (memorized) in the storage device 116.

Then, after the gate valve 136 is opened, the substrate 101, to which the substrate cover 10 whose position was measured has been attached, is transferred onto the XY stage 105 in the writing chamber 103 by the transfer robot 142. Then, after the gate valve 136 is closed, a predetermined pattern is written on the substrate 101 on the XY stage 105. The contents of the writing step (S108) are the same as those of Embodiment 1.

After finishing the writing, the gate valve 136 is opened so that the substrate 101 to which the substrate cover 10 has been attached may be conveyed from the XY stage 105 in the writing chamber 103 into the robot chamber 140 by the transfer robot 142. Then, after the gate valve 136 is closed, the substrate 101 is transferred into the substrate cover attaching/detaching chamber 147. Here, if the substrate cover 10 is detached from the substrate 101 in the state where the substrate 101 with the substrate cover 10 is mounted on the substrate cover attachment/detachment mechanism 30, the scratching mentioned above occurs. Thus, according to Embodiment 2, it operates as follows:

In the cover position measurement step (S110), after writing a pattern on the substrate 101, the measurement mechanism 50 under the control of the measurement processing unit 64 again measures the position of the substrate cover 10 in the state attached to the substrate 101, at the same position as the predetermined measurement position used to measure before the writing. The contents of the cover position measurement step (S110) are the same as those of Embodiment 1. However, according to Embodiment 2, the measurement mechanism 50 under the control of the measurement processing unit 64 calculates (x2, y2, θ2) as the position of the substrate cover 10 after writing. Then, the position information on the substrate cover 10 measured after writing is stored (memorized) in the storage device 116.

The contents of the positional deviation calculation step (S112) are the same as those of Embodiment 1. However, according to Embodiment 2, with respect to the position of the substrate 101 to which the substrate cover 10 has been attached, the positional deviation calculation unit 66 calculates a positional deviation amount ($\Delta x$, $\Delta y$, $\Delta \theta$) between the measured position ($x2$, $y2$, $\theta 2$) of the substrate cover 10 measured after writing and the measured position ($x1$, $y1$, $\theta 1$) of the substrate cover 10 measured before writing.

In the correction step (S114), the transfer robot 142 under the control of the correction processing unit 68 corrects the calculated positional deviation amount ($\Delta x, \Delta y$), with respect to the position of the substrate 101 to which the substrate cover 10 has been attached. The correction of the positional deviation amount ($\Delta x, \Delta y$) is performed by controlling the position of the arm of the transfer robot 142. The method of correcting the positional deviation amount ($\Delta x, \Delta y$) in the X and Y directions is the same as that of Embodiment 1. According to Embodiment 2, further, a rotation stage mechanism corrects a positional deviation amount ($\Delta \theta$) in the rotation direction, under the control of the correction processing unit 68. The rotation stage mechanism has a structure in which the three substrate support pins 40 and the rotating shaft 23 capable of horizontally rotating with centering on the central position of the three substrate support pins 40 are connected to the pedestal 21. Specifically, the correction is performed as follows: For example, as shown in FIG. 17C, in the state where the elevating shaft 28 is at the lowered position, the substrate 101 equipped with the substrate cover 10 whose positional deviation amount ($\Delta x, \Delta y$) in the X and Y directions has been corrected is arranged on three substrate support pins 40. Then, a positional deviation amount ($\Delta \theta$) is corrected by the rotation of the rotating shaft 23. The rotation stage mechanism is an example of a second correction unit. The positional deviation amount ($\Delta \theta$) is corrected by rotating the substrate 101 equipped with the substrate cover 10 by the rotation stage. According to the method described above, the position of the substrate cover 10 to be placed on the substrate cover attachment/detachment mechanism 30 can be returned to position of the substrate cover 10 before writing.

The contents of the cover detachment step (S116) are the same as those of Embodiment 1. According to Embodiment 2, the position of the substrate cover 10 after correction has been returned to the position where alignment was performed before writing by the three alignment support members 20, 22, and 24. Therefore, even if the substrate cover 10 starts contacting with the alignment support members 20, 22, and 24 because the elevating shaft 28 goes up, the substrate cover 10 does not move (slide laterally) in the planar direction. Alternatively, even if the moving (sliding laterally) occurs, the movement amount will be further smaller compared with Embodiment 1. Therefore, the sliding between the substrate cover 10 and the substrate 101 can be inhibited or further reduced. As a result, it is possible to inhibit or further reduce scratching of the substrate 101 due to the sliding.

Figure 18A:
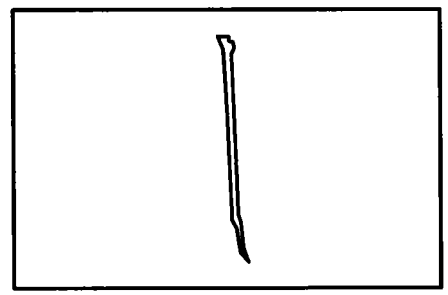
FIGS. 18A and 18B are for explaining an effect of the position correction according to Embodiment 2.
Figure 18B:
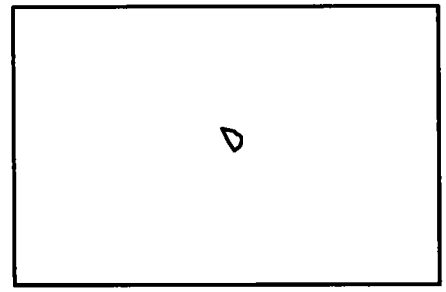
Figure 19:
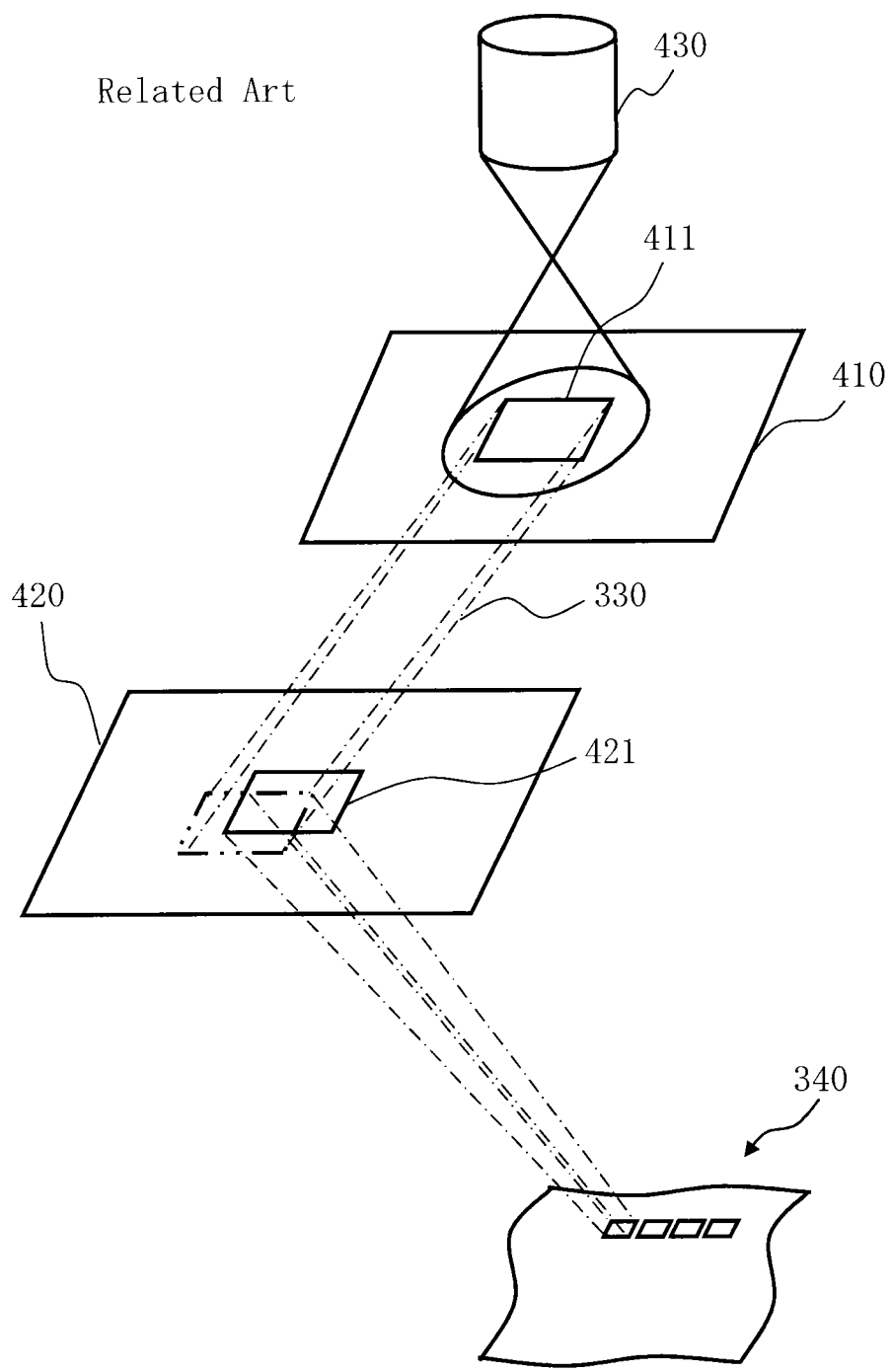
FIG. 19 is a schematic diagram explaining operations of a variable shaped electron beam writing apparatus.

FIGS. 18A and 18B are for explaining an effect of the position correction according to Embodiment 2. FIG. 18A shows, similarly to FIG. 14A, an example of scratching in the case of detaching the substrate cover 10 by the substrate cover attachment/detachment mechanism 30 without correcting the position of the substrate cover 10. On the other hand, as shown in FIG. 18B, by performing position correction of the substrate cover 10 according to Embodiment 2, the scratch size can be reduced much more than the result shown in FIG. 14B where the positional deviation (As) was not corrected. The result of FIG. 18B shows that the movement (lateral sliding) in the planar direction of the substrate cover 10 at the time of detaching the cover does not practically take place.

Moreover, according to Embodiment 2 similarly to Embodiment 1, the support table for supporting the substrate cover 10 and the support table for alignment of the substrate cover 10 are configured by the same three alignment support members 20, 22, and 24. Therefore, compared with the case where the support table for supporting the substrate cover 10 and the support table for alignment of the substrate cover 10 are separately provided, it is possible to suppress the risk of generating particles. The substrate cover 10 is detached from the substrate 101 by the substrate cover attachment/detachment mechanism 30 in the substrate cover attaching/detaching chamber 148 as described above.

The contents of the transfer-out step (S118) are the same as those of Embodiment 1.

Embodiment has been explained referring to concrete examples described above. However, the present invention is not limited to these specific examples. Although, according to Embodiment 2, the rotation stage mechanism corrects a positional deviation amount ($\Delta \theta$) in the rotation direction, it is not limited thereto. It is also acceptable that the transfer robot 142 corrects the positional deviation amount ($\Delta \theta$) of the position in the rotation direction in addition to the positions of the X and Y directions.

While the apparatus configuration, control method, etc. not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other cover attachment/detachment mechanism for the substrate, cover attachment/detachment method for the substrate, writing apparatus, and writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
a substrate cover attachment/detachment mechanism unit configured to attach or detach a substrate cover that covers a whole periphery of a substrate being a writing target from an upper part, to/from the substrate;
a writing unit configured to write a pattern on the substrate, in a state where the substrate cover has been attached to the substrate, by using a charged particle beam;
a position measurement unit configured, before and after performing writing by the writing unit, to measure a position of the substrate cover in a state attached to the substrate, at a predetermined measurement position; and
a correction unit configured, with respect to the position of the substrate cover in a state attached to the substrate, to calculate a positional deviation amount between a measured position of the substrate cover measured after writing and a measured position of the substrate cover measured before writing, and to correct the position of the substrate cover in a state attached to the substrate based on the positional deviation amount calculated.

2. The apparatus according to claim 1,
wherein the correction unit includes a transfer robot that transfers the substrate to which the substrate cover has been attached, to the writing unit.

3. The apparatus according to claim 1,
wherein the position measurement unit measures an X direction position, and a Y direction position, as the position of the substrate cover, and
the correction unit includes a first correction unit that corrects a positional deviation amount with respect to the X direction position and the Y direction position.

4. The apparatus according to claim 3,
wherein the position measurement unit further measures a rotation direction position, as a position of the substrate cover, and
the correction unit further includes a second correction unit that corrects a positional deviation amount of the rotation direction position, with respect to a position of the substrate to which the substrate cover has been attached.

5. The apparatus according to claim 4,
wherein the second correction unit includes a rotation stage that rotates the substrate to which the substrate cover has been attached.

6. The apparatus according to claim 1,
wherein the substrate cover includes three contact support members and a frame.

7. The apparatus according to claim 6,
wherein the three contact support members are fixed to be protruded more inward than an inner peripheral end of the frame and more outward than an outer peripheral end of the frame.

8. The apparatus according to claim 6,
wherein the substrate cover further includes three hemispherical convex portions, each of which is located at a corresponding backside side of the three contact support members, to be more outward than an outer peripheral end of the frame.

9. The apparatus according to claim 8,
wherein the substrate cover attachment/detachment mechanism unit supports the substrate cover by coming into contact against the three hemispherical convex portions.

10. The apparatus according to claim 8,
wherein the substrate cover attachment/detachment mechanism unit includes a plurality of support pins for supporting the substrate, and
the position measurement unit measures a position of the substrate cover in a state where the substrate is supported by the plurality of support pins and the three hemispherical convex portions are not supported by the substrate cover attachment/detachment mechanism unit.

11. The apparatus according to claim 9,
wherein the frame is configured by a plate and formed to have a periphery larger than the outer peripheral end of the substrate and an opening smaller than the outer peripheral end of the substrate, at a central part of an inner side of a frame.

12. The apparatus according to claim 1,
wherein the writing unit includes a writing chamber where the substrate to which the substrate cover has been attached is to be arranged,
further comprising a chamber in which the position measurement unit and the substrate cover attachment/detachment mechanism unit are arranged.

13. The apparatus according to claim 12,
wherein the correction unit transfers the substrate from the writing chamber to the chamber.

14. The apparatus according to claim 1,
wherein the position measurement unit captures an image such that one of four corners of the substrate cover is in an imaging range.

15. The apparatus according to claim 1,
wherein the position measurement unit includes three displacement sensors, one of the three displacement sensors measuring a distance in an X direction from the one to a first end surface of the substrate cover, a first another one of the three displacement sensors measuring a distance in a Y direction from the first another one to a second end surface of the substrate cover, and a second another one of the three displacement sensors measuring a distance in the X direction from the second another one to the first end surface of the substrate cover or a distance in the Y direction from the second another one to the second end surface of the substrate cover.

16. The apparatus according to claim 1,
wherein the substrate cover attachment/detachment mechanism unit detaches the substrate cover, the positional deviation amount of which has been corrected, from the substrate.

17. A charged particle beam writing method comprising:
attaching a substrate cover that covers a whole periphery of a substrate being a writing target from an upper part to the substrate;
measuring a position of the substrate cover in a state attached to the substrate, at a predetermined measurement position, before writing a pattern on the substrate;
writing a pattern on the substrate, in a state where the substrate cover has been attached to the substrate, by using a charged particle beam;
measuring a position of the substrate cover in a state attached to the substrate, at the predetermined measurement position, after writing a pattern on the substrate;
calculating a positional deviation amount between a measured position of the substrate cover measured after writing and a measured position of the substrate cover measured before writing, with respect to the position of the substrate cover in a state attached to the substrate;
correcting the position of the substrate cover in a state attached to the substrate based on the positional deviation amount calculated; and
detaching the substrate cover attached to the substrate, after the positional deviation amount having been corrected.

* * * * *